United States Patent
Lang et al.

(10) Patent No.: US 7,652,464 B2
(45) Date of Patent: Jan. 26, 2010

(54) RF POWER SENSOR WITH CHOPPING AMPLIFIER

(75) Inventors: David Lang, Phoenix, AZ (US); Noel Lopez, Phoenix, AZ (US)

(73) Assignee: ViaSat, Inc., Carlsbad, CA (US)

( * ) Notice: Subject to any disclaimer, the term of this patent is extended or adjusted under 35 U.S.C. 154(b) by 189 days.

(21) Appl. No.: 11/744,739

(22) Filed: May 4, 2007

(65) Prior Publication Data

US 2008/0012644 A1 Jan. 17, 2008

Related U.S. Application Data

(60) Provisional application No. 60/798,233, filed on May 5, 2006.

(51) Int. Cl.
*G01R 25/02* (2006.01)
(52) U.S. Cl. ........................................................ 324/95
(58) Field of Classification Search ........................ None
See application file for complete search history.

(56) References Cited

U.S. PATENT DOCUMENTS

| | | | | |
|---|---|---|---|---|
| 4,647,848 | A * | 3/1987 | Barrett | 324/95 |
| 5,177,453 | A * | 1/1993 | Russell et al. | 330/284 |
| 5,204,613 | A * | 4/1993 | Cripps et al. | 324/95 |
| 5,381,115 | A * | 1/1995 | Timmons et al. | 330/279 |
| 6,204,727 | B1 * | 3/2001 | Wey et al. | 324/119 |
| 6,291,984 | B1 | 9/2001 | Wong et al. | |
| 6,472,860 | B1 | 10/2002 | Tran et al. | |
| 6,989,664 | B2 * | 1/2006 | Shim et al. | 324/96 |
| 2003/0214309 | A1 * | 11/2003 | Shim et al. | 324/637 |
| 2004/0127182 | A1 * | 7/2004 | Hayashi | 455/193.1 |

FOREIGN PATENT DOCUMENTS

| | | |
|---|---|---|
| EP | 0 320 265 A | 6/1989 |
| JP | 09 219628 A | 8/1997 |
| WO | 01/36988 A | 5/2001 |

OTHER PUBLICATIONS

Christoforou Y et al: "A chopper-based, CMOS current sense amplifier for power management applications in mobile communications", Telecommunications in Modern Satellite, Cable and Broadcasting Service, 2001. Telsiks 2001. 5th International Conference on Sep. 19-21, 2001, Piscataway, NJ, USA, IEEE, vol. 1, Sep. 19, 2001, pp. 149-150, XP010560912, ISBN: 0-7803-7228-X, figure 2.

* cited by examiner

*Primary Examiner*—Jermele M Hollington
(74) *Attorney, Agent, or Firm*—Snell & Wilmer, LLP

(57) ABSTRACT

An RF power detector having a wide dynamic range may comprise a chopping amplifier and is configured to detect pulsed high frequency RF signals. The chopping amplifier controlled by a bias current regulator amplifies and chops an RF signal by periodically enabling and disabling the amplifier according to a system clock. The chopped high frequency RF signal feeds a Schottky diode biased to operate in the square law region for weak signals. The Schottky diode voltage is tapped and high pass filtered. The voltage drives a logarithmic and linear converter. The converter outputs are summed to produce an output voltage that is a repeatable and stable monotonically increasing function of the RF power.

26 Claims, 4 Drawing Sheets

RF POWER SENSOR WITH CHOPPING AMPLIFIER

CROSS-REFERENCE TO RELATED APPLICATIONS

This application is a non-provisional application of and claims priority to U.S. Provisional Application No. 60/798,233 filed on May 5, 2006 and entitled "High Accuracy RF Power Detector", which application is incorporated herein by reference.

FIELD OF INVENTION

The present invention relates to radio frequency (RF) power detectors. More particularly, the invention relates to a sensitive and accurate RF power detector having a wide dynamic range and configured to sense short pulses of very high frequency RF signals.

BACKGROUND OF THE INVENTION

Many communications and RADAR systems operate at RF frequencies of Ku Band or higher. In many of these systems it is necessary to continuously monitor and adjust the transmitted RF power level and the gain of the receiver (or transmitter) in order to compensate for changing link conditions such as atmospheric changes in weather conditions, interference, movement or changes in orientation of the terminals. To accomplish this, RF power levels are sampled using an RF power detector and RF gain or signal levels are adjusted as appropriate. Since many transmission systems are pulsed in nature, the RF power detector for a pulsed transmission system must be able to react and settle to a stable measurement value fast enough to accurately measure the RF pulse before the pulse ends.

At these frequencies, commercially available RF power sensors have limited sensitivity, pulse settling speed, dynamic range and accuracy. They also tend to be large in size making them inadequate for many potential applications. A few commercially available RF power sensors have relatively small dimensions of less than 0.3"×2.5"×3". These power detectors, however, have limited operating frequencies or environmental sensitivities that limit their use to applications with operating frequencies of 25 GHz or less or applications that have laboratory like environmental conditions.

RF power sensors operating in these regions have limited sensitivity, pulse settling speed, dynamic range and accuracy for a variety of reasons. The RF signals are frequently low in power have fairly low signal to noise temperature ratios. Inductive noise currents and component variations often add unwanted noise and errors. Temperature and environmental changes frequently effect component response and add Direct Current (DC) and low frequency biases into the amplification circuits. Other low frequency and DC noise sources sometimes introduce significant errors in power measurement.

Those skilled in the art will recognize that there is a need for a small sensitive and accurate RF power detector having a wide dynamic range for sensing short pulses of very high frequency signals in a variety of environments. The invention addresses this need as well as others.

SUMMARY OF THE INVENTION

In accordance with an exemplary embodiment of the present invention, an amplifier is configured to receive an RF signal. In one exemplary embodiment, the amplifier output is controlled by a pulsed current regulator that "chops" the RF signal by periodically turning the amplifier output "on" and "off" according to a system clock. In this exemplary embodiment, the pulsed amplifier output current feeds the "chopped" RF signal to a Schottky diode. The diode is forward biased to maximize its weak signal sensitivity. To maximize the dynamic range of the detector the diode is operated in the square law region for weak RF signals and in the linear region for other (strong) RF signals. This may involve two converters, a logarithmic converter for the weak signals and a linear converter for the strong signals. The logarithmic converter and linear converter output currents may be summed to form a sum current that is a smoothly monotonically increasing function of the RF signal power. This summed analog output can then be converted to a digital output.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF EXEMPLARY EMBODIMENTS

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
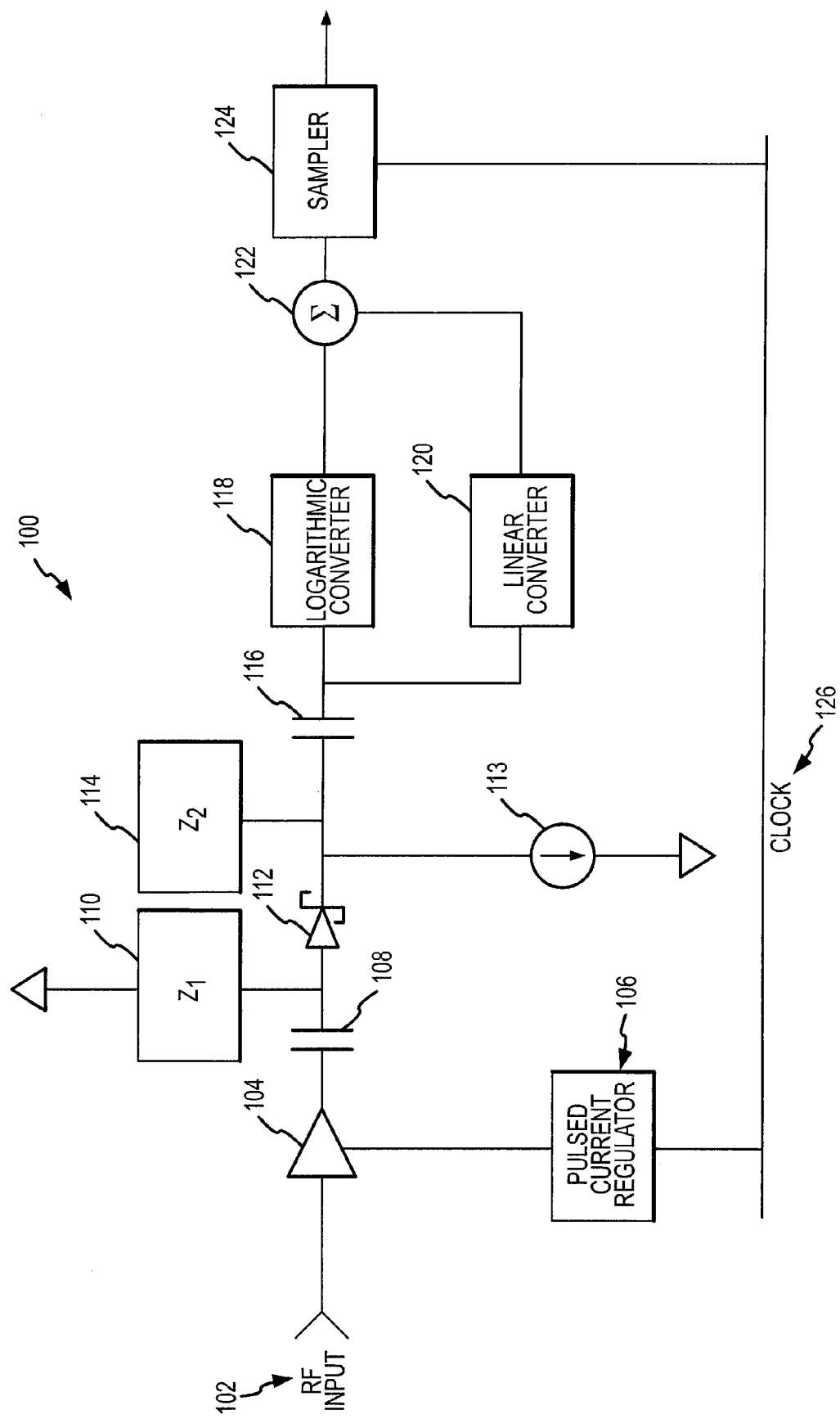
FIG. 1 shows a schematic diagram of an exemplary RF power detector according to an embodiment of the present invention.

In accordance with an exemplary embodiment of the present invention, and with reference to FIG. 1, an RF sensor 100 comprises an RF input 102, an amplifier 104, a Schottky diode 112, a logarithmic converter 118, a linear converter 120, a summing junction 122, a sampler 124 and/or a pulsed current regulator 106. RF sensor may further comprise a blocking capacitor 108, a high pass capacitor 116, and/or a current source 113.

In accordance with one exemplary embodiment of the present invention, RF input 102 is connected to the input of amplifier 104. Amplifier 104 is connected with pulsed current regulator 106 and has an output that is connected with a first end of blocking capacitor 108. Blocking capacitor 108 has a second end that is connected with passive network Z1 110 and the anode of Schottky diode 112. Schottky diode 112 has a cathode connected with passive network Z2 114, a first end of high pass capacitor 116, and current source 113. The other end of high pass capacitor 116 is connected with the input of logarithmic converter 118 and the input of linear converter 120. Logarithmic converter 118 and linear converter 120 have outputs that are connected to the inputs of summing junction 122. Summing junction 122 has an output connected with sampler 124. Sampler 124 is connected to system clock 126 that is also connected with pulsed current regulator 106.

In accordance with one exemplary embodiment of the present invention, RF sensor 100 is configured to receive an RF signal, chop the RF signal, filter the chopped signal, and then sample the filtered signal. In various exemplary embodiments, RF sensor 100 is configured to facilitate detection of high frequency RF signals using relatively inexpensive components typically used for low frequency applications and that are not typically suitable for high frequency applications.

In accordance with various exemplary embodiments of the present invention, the detector is configured to measure constant-envelope RF signals or signals exhibiting negligible change in envelope power over one system clock cycle. A constant-envelope is a modulated signal in which the peak-to-peak amplitude of the carrier is constant, over a time duration of at least one modulation cycle at the lowest modulating frequency.

In one exemplary embodiment, RF input 102 is a waveguide, and/or coax. Furthermore, RF input 102 may comprise any connector or point of contact configured to receive high frequency RF signals. In accordance with various exemplary embodiments, the RF signal received has a frequency greater than Ku band frequencies. In other embodiments, high frequency means greater than 25 GHz. In yet further embodiments, high frequency means greater than 45 GHz. Thus, the received RF signal may comprise an RF signal of any suitably high frequency.

Furthermore, the received RF signal may have a relatively short duration (pulse) as may be the case in Radar applications, frequency hopping, and/or the like. In one exemplary embodiment the duration of the pulse may be less than 500 ns, less than 100 ns, or even less than 50 ns. Moreover, the RF signal may be of any suitably short duration where, for example, it would be difficult to employ time averaging methods to improve the accuracy of weak signals.

In accordance with various exemplary embodiments of the present invention, detector or RF sensor 100 may be configured to receive RF signals over a wide dynamic range; i.e., RF sensor 100 may be configured to cover very weak to very strong signals. For example, RF sensor 100 may be configured to have a range of 50 dB. The dynamic range of RF sensor 100, however, may be of any suitable size.

In accordance with a further exemplary embodiment of the present invention, the high frequency RF signals are amplified by amplifier 104. For example, amplifier 104 may be a Triquint TGA 4042 amplifier. In other exemplary embodiments, amplifier 104 may be a Eudyna FMM5715X, United Monolithics Semiconductors CHA2098b99F, one of similar amplifiers provided by Hittite and M/A Com, and/or the like. Furthermore, amplifier 104 may comprise any amplifier that is configured to "chop" the RF signal. In an exemplary embodiment, amplifier 104 is configured to be turned "on" and "off" by a control signal provided by pulsed current regulator 106. The control signal periodically drives amplifier 104 "on" and "off" causing amplifier 104 to output a "chopped" and amplified RF signal. Chopping is also known as synchronous modulation/demodulation.

The gain of the amplifier may be chosen to maximize the operating range of the diode. The gain of the amplifier is one of the items defining the signal level presented to the diode. To maximize the operating range, for example for the Agilent HSCH-5330 diode, it is desirable to present a signal level of +10 dBm to −40 dBm. For the top 20 dB of this range the diode operates in the linear range and for the bottom 30 dB the diode operates in the square law range. It may also be useful to select an amplifier that saturates in RF output power below the maximum non-damage level of the diode. Amplifier 104 also isolates the diode from impedance pulling all the RF port which will affect sensitivity of diode.

In this exemplary embodiment, pulsed current regulator 106 may be a pass FET or switching FET from IR (international rectifier) with some conditioning circuitry between the gate of the pass FET and the micro-controller. Furthermore, pulsed current regulator may comprise any device that is configured to generate a control signal that in turn is configured to turn amplifier 104 "on" and "off" to output a chopped and amplified RF signal. In various exemplary embodiments, this control signal is generated based on system clock 126. Regulator 106 may be configured to regulate the DC operating point within the time duration of each 'high' clock pulse.

In one exemplary embodiment, the chopped and amplified RF signal is received by DC blocking capacitor 108. DC blocking capacitor 108 may comprise any suitable capacitor. The size of capacitor 108 may depend on the system clock or in other words the chopping frequency. In one exemplary embodiment, DC blocking capacitor 108 comprises a capacitor having a capacitance in the range of 1 pF to 100 uF. DC blocking capacitor 108, however, may comprise any combination of capacitors of any suitable capacitance that is configured to remove the DC and pass the chopped AC voltage envelope developed in the diode.

Those skilled in the art will recognize there are many ways of chopping a RF signal. For example, the RF signal can be mixed in an RF mixer with a square wave. One way is to use a series, shunt, or combination in the RF path. As mentioned above, it may be desirable to limit the signal level available to the diode to keep the diode from getting damaged. A RF limiter could be added after the RF switches to accomplish this function. A RF limiter can be implemented using PIN diodes that clamp down when the signal is too big. In one exemplary embodiment, amplifier 104 is configured to perform both the function of the RF chopping and the limiting function. In a further embodiment, amplifier 104 is also configured to provide the third function of providing gain. It is therefore possible, in other exemplary embodiments, to implement the present invention without amplification of the RF signal. Thus, RF sensor 100 may comprise any suitable component or combination of components that are configured to amplify, limit, and/or chop the RF signal.

In a further exemplary embodiment, the chopping is performed in accordance with a known duty cycle. For example, the chopping may be performed on a periodic basis. In this regard, the chopping may be based, for example, on the system clock. Although the system clock often has a set frequency, the present invention is not limited to a set frequency for chopping. For example, the invention may be used in connection with an adaptive system clock or the like. Thus, any duty cycle may be used to the extent that it is still possible to convert the summing output voltage to a detected power level. Furthermore, the chop frequency may be changed in exemplary embodiments.

In this exemplary embodiment, the output of DC blocking capacitor 108 is provided to the anode of Schottky diode 112. In one exemplary embodiment, Schottky diode 112 may be an Agilent HSCH-5330 Schottky diode. Although described herein as a Schottky diode, Schottky diode 112 may comprise any suitable transduction element, such as a transistor or wave tube. Thus, Schottky diode 112 may be any transduction element that is configured to sense the amplifier chopped output power and produce a proportional voltage envelope signal.

In accordance with a further exemplary embodiment of the present invention, Schottky diode 112 acts as a transduction element by sensing the amplifier current and providing a cathode voltage that is a function of the amplifier current. Schottky diode 112 may be forward biased by a quiescent current provided by current source 113. The current source 113 may be configured to provide enough quiescent current to drive Schottky diode 112 into the square law operating region when a very weak RF signal is input into the RF input 102. Thus, Schottky diode 112 may be configured to have a cathode voltage proportional to the square of the chopped and amplified RF signal current for weak RF signals and directly proportional for other RF signals. Stated another way, the voltage at the cathode of diode 112 may comprise the constant forward junction drop due to the bias current of current source 113, plus a step function change in voltage due to the detection of RF signals present at the output of amplifier 104 during its enabled period.

In accordance with a further exemplary embodiment of the present invention, passive network Z1 110 is configured to provide a DC ground to Schottky diode 112 as well as match the amplifier output impedance minimizing signal reflections and maximizing conductance through Schottky diode 112. Furthermore, passive network Z2 114 may not be DC grounded and may have a low RF impedance. Passive network Z2 114 in combination with high pass capacitor 116, logarithmic converter 118 and linear converter 120 forms a high pass filter for the voltage at the cathode of Schottky diode 112. This high pass filter is configured to remove the DC and low frequency components of the Schottky diode 112 cathode voltages. Removing the DC increases the accuracy of the logarithmic detector. Removing the DC removes DC error or offsets found in the logarithmic detector and the biasing of the detector diode. This DC error or offset also changes as a function of temperature so removing it also reduces errors related to these factors. This is especially significant at low signal levels where the detector output might be µV or mV. At such low levels, a small DC error can swamp any small signal level.

Logarithmic converter 118 is configured to "linearize" Schottky diode 112 cathode voltages when the Schottky diode is operating in the square law region. In an exemplary embodiment, logarithmic converter 118 is an Analog Devices, AD 8307 device. An exemplary transfer function of logarithmic converter 118 may be:

$$Log(1+abs(Vh/Vref))$$

where Vh is the logarithmic converter input voltage and
where Vref is chosen to limit the marginal response when the Schottky diode is operating in the linear region.

In this embodiment, the use of a logarithmic converter 118 provides a near linear output when the Schottky diode is operating in the square law region. In other embodiments, logarithmic converter may be any device that is configured to provide a near linear output when the Schottky diode is operating in the square law region. The use of converters other than logarithmic converters is also contemplated. A logarithmic converter may be omitted for embodiments where sampler 124 (explained hereinafter) has a very fast response and good sensing granularity.

In another exemplary embodiment, linear converter 120 is configured to convert Schottky diode 112 voltages, particularly when Schottky diode 112 is operating in the linear region. An exemplary transfer function of linear converter 120 may be: Abs(Vh). In an exemplary embodiment, linear converter 120 may be a simple non-inverting op-amp. In an exemplary embodiment, the use of a linear converter 120 provides a near linear output when the Schottky diode is operating in the linear region. The use of converters other than linear converters is also contemplated. A linear converter may be omitted for embodiments where sampler 124 (explained hereinafter) has a very fast response and good sensing granularity. In general, the presence of one or both converters 118 and 120 facilitates a greater dynamic range. It should be understood, however, that if less range is acceptable, one or both of the converters could be removed.

In accordance with further exemplary embodiments of the present invention, the output currents of logarithmic converter 118 and linear converter 120 are summed in summer 122 to produce a current that is the monotonically increasing function of the RF signal. Linear converter 120 contributes most of the current when the Schottky diode 112 is operating in the linear region and logarithmic converter 118 contributes most of the current when Schottky diode 112 is operating in the square law region. This provides an output current having a magnitude that is pseudo-linear with respect to the RF signal. In this embodiment the summing junction 122 is configured to sum the outputs of logarithmic converter 118 and linear converter 120. Other embodiments may feature no converters, a single logarithmic converter, a single linear converter or a plurality of converters.

In accordance with further exemplary embodiments of the present invention, sampler 124 samples the current from summer 122 and outputs a representation of the magnitude of the current. The representation may be either digital or analog. In accordance with one exemplary embodiment of the present invention, sampler 124 may comprise an analog to digital converter such as the AD7478. Sampler 124 may be configured to sample the output voltage of summer 122 over a narrow time interval. The output of sampler 124 may be read by a digital computer or equivalent and processed to derive the detected RF signal.

Furthermore, sampler 124 may be clocked with system clock 126 (similar to the pulsed current regulator). Alternate embodiments feature asynchronous samplers. The use of an analog meter or equivalent instead of sampler 124 is also contemplated.

Figure 2:
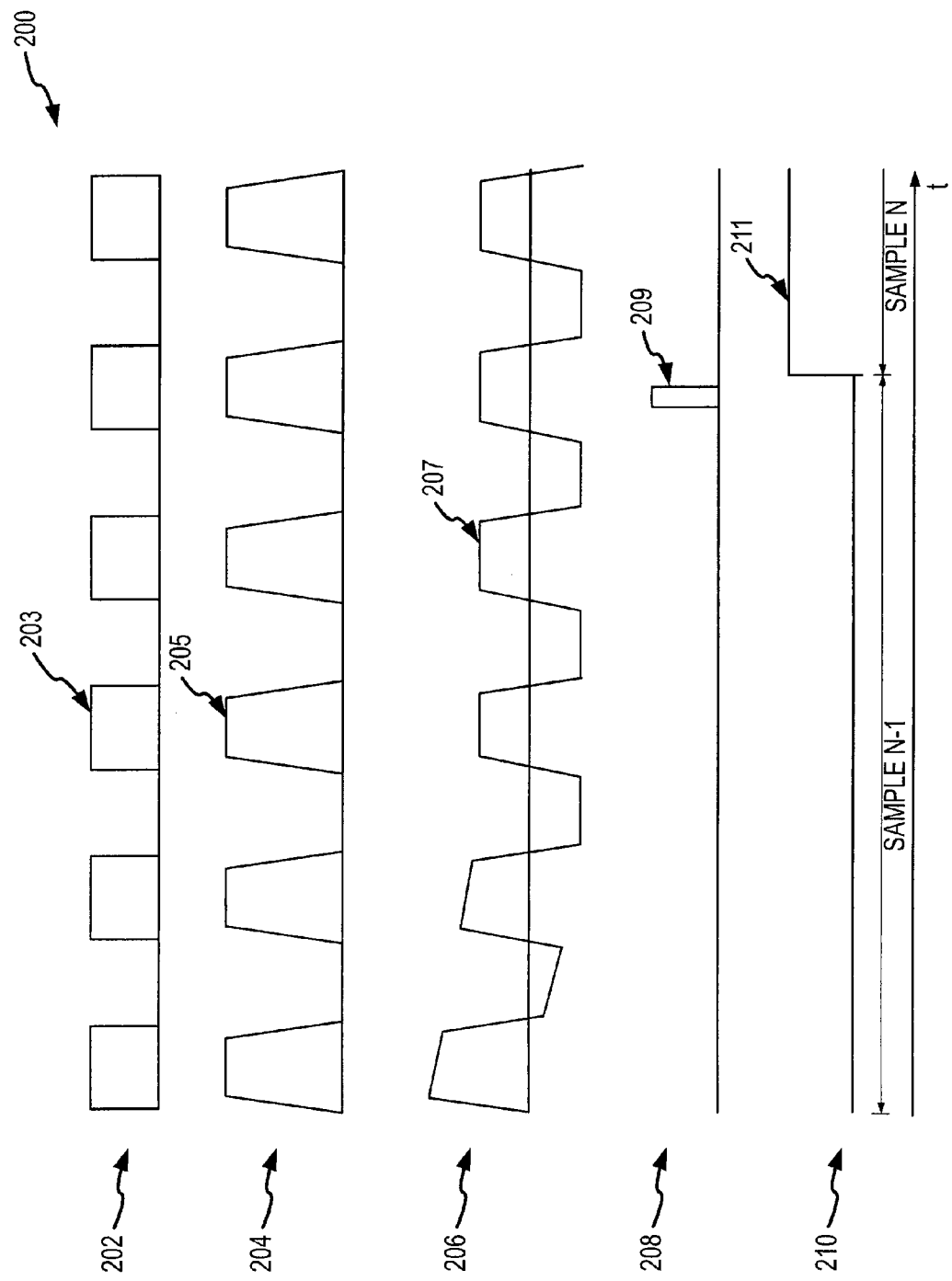
FIG. 2 shows an exemplary timing diagram for the RF power detector shown in FIG. 1.

FIG. 2 illustrates an exemplary timing diagram 200 for the RF power detector shown in FIG. 1. A first timeline 202 shows a timing diagram of a system clock 126 output waveform 203 that drives pulsed current regulator 106 and sampler 124. In an exemplary embodiment, the clock signal frequency is lower than the RF input frequency and determines the chop frequency.

A second time line 204 shows the amplifier 104 operating current 205. The operating current 205 is determined primarily by the pulsed current regulator 106. The pulsed current regulator 106 supplies operating current to the amplifier turning the amplifier "on" and "off" sympathetically with the system clock waveform shown in the first timeline 202.

A third timeline 206 shows the input waveform 207 to logarithmic converter 118 and linear converter 120. The waveform shows the envelope of the amplified and chopped RF signal before entering the converters 118, 120. The third timeline 206 shows the effect of the high pass filter formed by the logarithmic converters 118, 120 passive network Z2 114 and high pass capacitor 116. The third timeline 206 shows the removal of the DC component.

A fourth timeline 208 shows a sample pulse 209 that may be sent to sampler 124. A microprocessor or other sampling device may send the pulse to command Sampler 124 to update its output.

A fifth timeline 210 shows a representative output bit 211 from the sampler 124. Sampler 124 output is updated according to commands shown in the fourth timeline.

Figure 3:
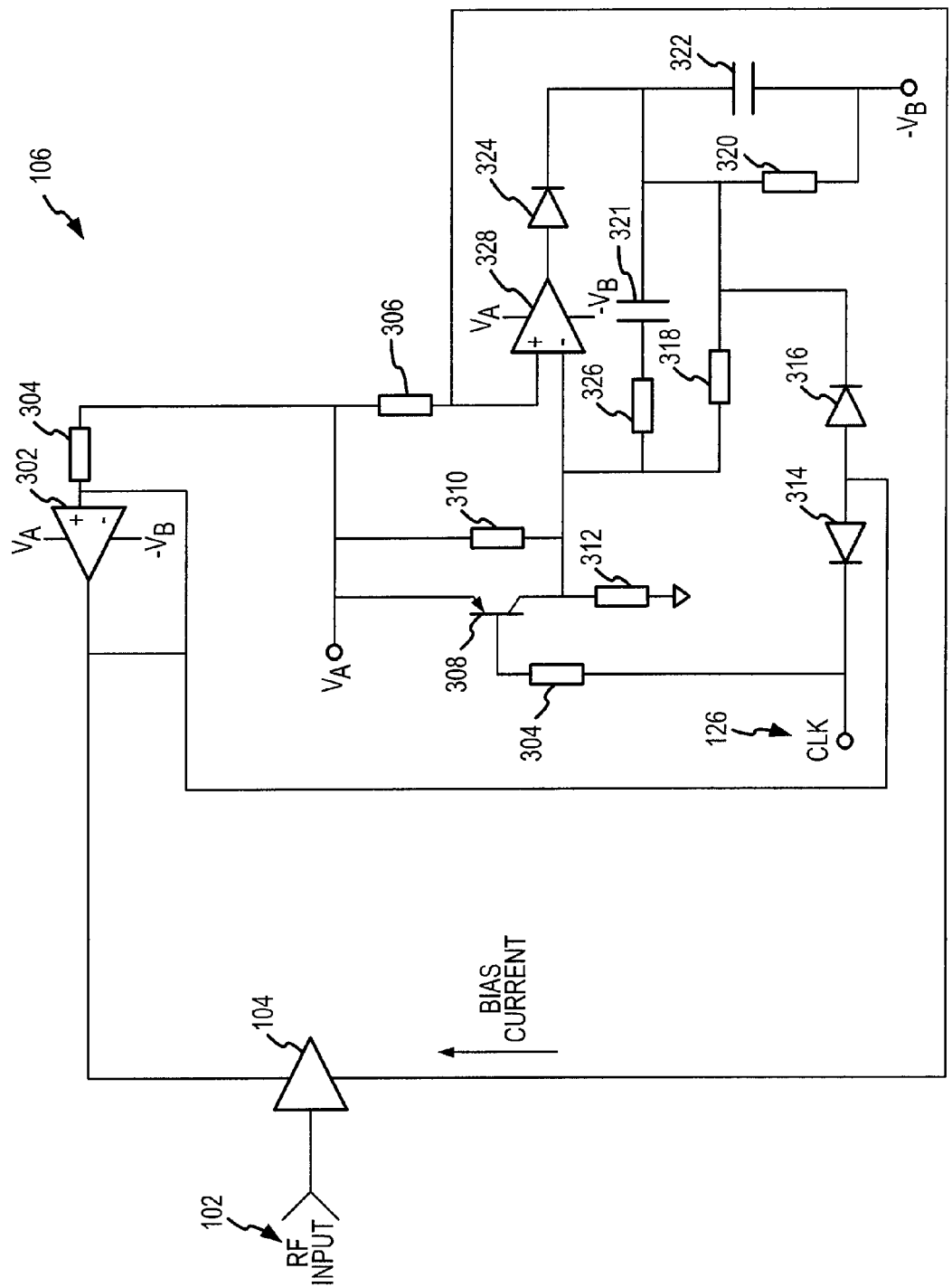
FIG. 3 shows an exemplary pulsed bias regulator for the RF power detector shown in FIG. 1.

In accordance with an exemplary embodiment of the present invention, and with reference now to FIG. 3, an exemplary bias current regulator 106 is described in further detail. Bias current regulator 106 is connected with amplifier 104 that is in turn connected with RF input 102. Amplifier 104 is connected with the output of opamp 302. Opamp 302 is supplied with positive voltage Va and negative voltage Vb. The non-inverting input of opamp 302 is connected with circuit element 304. Circuit element 304 is connected with positive voltage Va and circuit element 306. Positive voltage Va is also connected with the emitter of PNP transistor 308 and circuit element 310. The other end of circuit element 310 is connected with the collector of transistor 308. The collector of transistor 308 is grounded through circuit element 312. The base of transistor 308 is connected with clock 126 through circuit element 304.

The clock 126 is connected with the non-inverting input of opamp 302 through diode 314. The anode of diode 314 is connected with the anode of diode 316. The cathode of diode 316 is connected with circuit elements 318 and 320. Circuit element 320 is connected to negative voltage Vb through circuit element 320. Negative voltage Vb is connected with capacitor 322 that in turn is connected with capacitor 321 and the diode 324. Capacitor 322 is also connected with the inverting output of opamp 328. Opamp 328 is supplied with positive voltage Va and negative voltage Vb. Opamp 328 has output tied to the anode of diode 324. Opamp 328 has inputs connected to circuit elements 310 and 312 and to the collector of transistor 308. Transistor 308 base connects to clock 126 and the collector connects to resistors 310 and 312.

Circuit elements 304, 310 and 312 bias transistor 308 and may be configured to receive, level shift, and scale clock 126. Circuit elements 306, 318, 320 322, 324, and 326 provide a stable feedback loop for opamp 328. Together they provide the non-inverting input of opamp 302 with a level shifted and scaled input between positive voltage Va and negative Voltage Vb.

The pulsed current regulator 106 level shifts and scales the clock voltage from positive voltage Va to negative voltage Vb. Opamps 302 and 328 are configured to source voltage from positive voltage Va to negative voltage Vb. Amplifier 104 is "turned" off when the output voltage of opamp 302 is low. When voltage output of opamp 302 is voltage Va (high), amplifier 104 is turned on. When output voltage of op-amp 302 is −Vb (low) the amplifier 104 is turned off. An exemplary output waveform of opamp 302 is shown in the third timeline 206.

Although one exemplary bias circuit regulator 106 has been describe, other circuits may be used for chopping an RF input into a periodic waveform. The pulsed current regulator 106 set forth herein merely provides one suitable embodiment.

Figure 4:
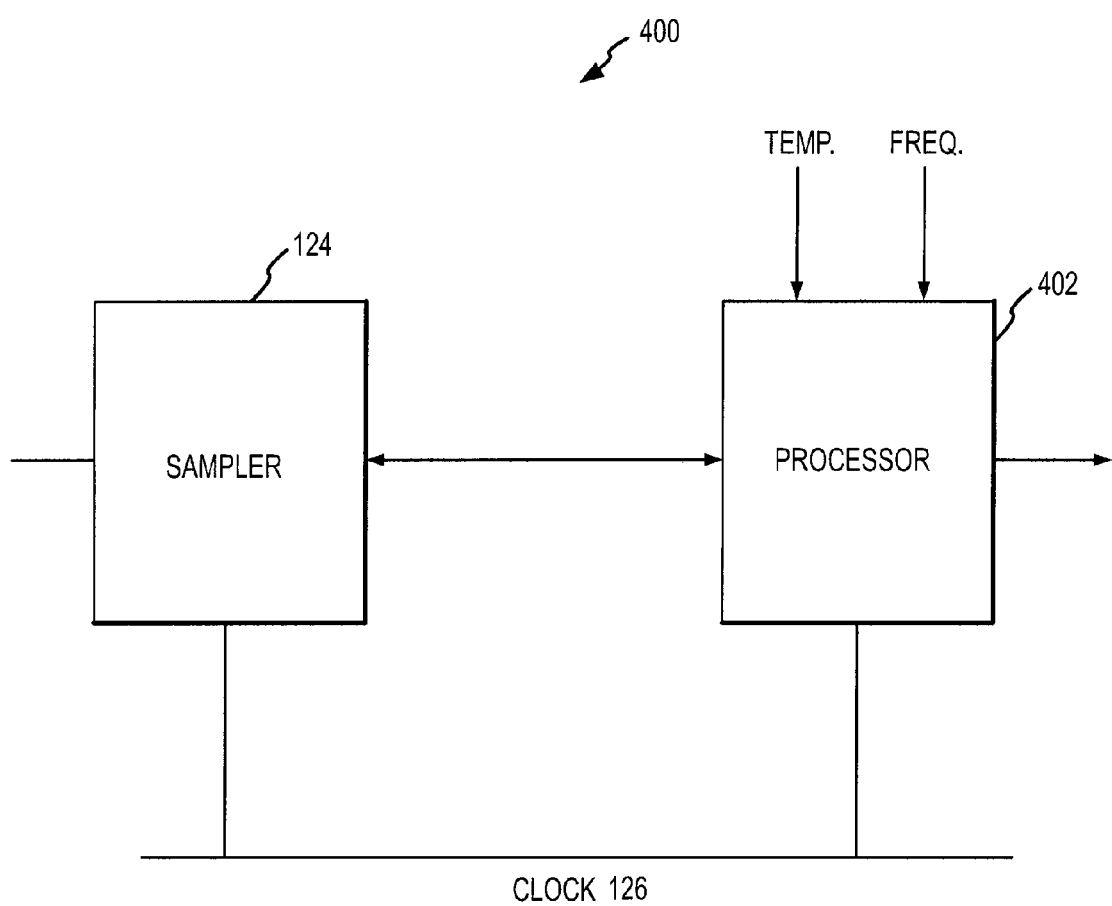
FIG. 4 shows an exemplary sampler embodiment for the RF power detector shown in FIG. 1.

FIG. 4 shows an exemplary sampler embodiment 400 of the sampler 124.

Sampler 124 is configured to be in communication with microprocessor 402.

Sampler 124 and microprocessor 402 are in communication with clock 126. The microprocessor may be configured to receive temperature and/or possibly frequency inputs. The microprocessor 402 may periodically issue a sample and hold command to sampler 124.

In various exemplary embodiments, the detector may be characterized to generate a look-up table of the voltage peak to peak of the waveform 207 versus power level. The data may be taken over temperature to further improve accuracy of the detector. The microprocessor may then read the sampler 124 output, the temperature and/or frequency inputs and calculate the detected RF power through a look-up table.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. An RF power sensor comprising:
an amplifier configured to receive an RF input signal and to generate a series of RF pulses by periodically amplifying the RF input signal;
a diode in series with the amplifier, wherein the diode is configured to convert the series of RF pulses to a detected signal, wherein the detected signal has a lower frequency than the RF input signal; and
a high pass filter in series with the diode and configured to filter the DC and low frequency components from the detected signal to produce a high pass filtered signal comprising a series of pulses wherein the high pass filter further comprises a logarithmic converter that is configured to generate a first series of current pulses that are log proportional to an absolute value of the high pass filtered voltage.

2. The RF power sensor of claim 1 wherein the diode is a Schottky diode.

3. The RF power sensor of claim 1 wherein the amplifier includes a field effect transistor.

4. The RF power sensor of claim 3 wherein the field effect transistor is a pseudo-morphic high electron mobility transistor.

5. The RF power sensor of claim 1 further comprising a pulsed current regulator for controlling the amplifier.

6. The RF power sensor of claim 5 wherein the pulsed current regulator turns the amplifier on and off periodically based on a clock signal.

7. The RF power sensor of claim 1 further comprising a linear converter in parallel with the logarithmic converter for generating a second series of current pulses proportional to the absolute value of the high pass filtered voltage.

8. The RF power sensor of claim 7 further comprising a junction for summing the first and second series of current pulses to produce a third series of current pulses that is a monotonically increasing function of absolute value of the high pass filtered voltage.

9. The RF power sensor of claim 1 wherein the high pass filter comprises a capacitor.

10. A method for detecting high frequency pulsed RF signals over a wide dynamic range, the method comprising the steps of:
receiving an RF signal at an RF signal input;
chopping the RF signal into an RF pulse train having a known duty cycle;
detecting the pulse train with an envelope detector to create a detected envelope voltage signal having a lower frequency than the RF signal;

high pass filtering the detected envelope voltage signal to remove low frequency components of the detected envelope voltage signal and to create a time varying signal; and creating an output signal based on the detected envelope voltage signal, wherein the output signal is proportional to the RF signal received at RF signal input.

11. The method of claim 10, wherein the relationship between said RF signal and said output signal is logarithmic.

12. The method of claim 10, wherein creating an output signal further comprises the step of digitally sampling the time varying signal to create the output signal, and wherein said output signal is a digital signal.

13. The method of claim 12, further comprising the step of translating the digital signal into a digital bits representative of said RF signal by comparing the digital signals to RF signal values in a look up table.

14. The method of claim 10, wherein the minimum and maximum of the output signal is proportional to the RF input signal levels.

15. The method of claim 10, wherein the output signal is not influenced by environmental factors including: temperature changes, weather changes, and aging of parts.

16. The method of claim 10, wherein said RF signal has a frequency greater than 27 GHz, a dynamic range of at least 50 dB, and an RF signal pulse duration of less than 20 ns.

17. A high frequency pulsed RF signal detector configured to detect RF signals having a wide dynamic range, the RF signal detector comprising:

an amplifier configured to chop a received RF input signal, wherein said RF input signal has a high frequency and short duration;

a Schottky diode configured to produce a proportional voltage envelope signal from said chopped signal;

a high pass filter for attenuating low frequency components of said proportional voltage envelope signal;

a logarithmic converter for outputting a first series of current pulses that are log proportional to said envelope signal;

a linear converter in parallel with the logarithmic converter for outputting a second series of current pulses that are proportional to said envelope signal;

a summing junction configured to produce a third series of current pulses that are proportional to the sum of the first and second series of current pulses, wherein the third series of current pulses is a monotonically increasing function of the output voltage; and a sampler configured to generate an output signal that is representative of the RF input signal.

18. The apparatus of claim 17, wherein said sampler further comprises an analog to digital sampler.

19. The apparatus of claim 17 further comprising a signal processor connected to the digital sampler and configured to correct power measurements.

20. The apparatus of claim 17 wherein the logarithmic converter has a dynamic range that is tuned to a square law operating region of the Schottky diode.

21. A method for measuring RF power in connection with high frequency pulsed RF signals, the method comprising the steps of:

receiving an RF signal having a frequency greater than 26 GHz;

periodically amplifying and attenuating the RF signal to generate a a detected signal having a frequency less than 26 GHz; and filtering the detected signal to eliminate DC and low frequency components.

22. The method of claim 21 further comprising the step of sampling the detected signal.

23. The method of claim 21 further comprising the step of compensating for non-linearities in the detected signal.

24. The method of claim 21 wherein the detected signal is generated using a Schottky diode.

25. An RF power sensor comprising:

an amplifier configured to receive an RF input signal and to generate a series of RF pulses by periodically amplifying the RF input signal;

a diode in series with the amplifier, wherein the diode is configured to convert the series of RF pulses to a detected signal, wherein the detected signal has a lower frequency than the RF input signal;

a high pass filter in series with the diode and configured to filter the DC and low frequency components from the detected signal to produce a high pass filtered signal comprising a series of pulses; and a linear converter in parallel with the logarithmic converter for generating a second series of current pulses proportional to the absolute value of the high pass filtered voltage.

26. The RF power sensor of claim 25 wherein the high pass filter further comprises a logarithmic converter that is configured to generate a first series of current pulses that are log proportional to an absolute value of the high pass filtered voltage.

* * * * *

UNITED STATES PATENT AND TRADEMARK OFFICE
CERTIFICATE OF CORRECTION

PATENT NO. : 7,652,464 B2
APPLICATION NO. : 11/744739
DATED : January 26, 2010
INVENTOR(S) : David Lang et al.

It is certified that error appears in the above-identified patent and that said Letters Patent is hereby corrected as shown below:

Claims 25 and 26 should be amended as follows:

In column 10, lines 27-42, claim 25 should be amended as follows:

25. An RF power sensor comprising:

an amplifier configured to receive an RF input signal and to generate a series of RF pulses by periodically amplifying the RF input signal;

a diode in series with the amplifier, wherein the diode is configured to convert the series of RF pulses to a detected signal, wherein the detected signal has a lower frequency than the RF input signal; and a high pass filter in series with the diode and configured to filter the DC and low frequency components from the detected signal to produce a high pass filtered signal comprising a series of pulses; and wherein the high pass filter further comprises a linear converter that is configured to generate in parallel with the logarithmic converter for generating a second a first series of current pulses proportional to the absolute value of the high pass filtered voltage.

In column 10, lines 43-47, claim 26 should be amended as follows:

26. The RF power sensor of claim 25, wherein the high pass filter further comprises a logarithmic converter that is configured to generate in parallel with the linear converter a second a first series of current pulses that are log proportional to an absolute value of the high pass filtered voltage.

Signed and Sealed this

Thirteenth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,652,464 B2
APPLICATION NO. : 11/744739
DATED : January 26, 2010
INVENTOR(S) : David Lang et al.

It is certified that error appears in the above-identified patent and that said Letters Patent is hereby corrected as shown below:

Claims 25 and 26 should be amended as follows:

In column 10, lines 27-42, claim 25 should be amended as follows:

25. An RF power sensor comprising:
an amplifier configured to receive an RF input signal and to generate a series of RF pulses by periodically amplifying the RF input signal;

a diode in series with the amplifier, wherein the diode is configured to convert the series of RF pulses to a detected signal, wherein the detected signal has a lower frequency than the RF input signal; and a high pass filter in series with the diode and configured to filter the DC and low frequency components from the detected signal to produce a high pass filtered signal comprising a series of pulses; and wherein the high pass filter further comprises a linear converter that is configured to generate a first series of current pulses proportional to the absolute value of the high pass filtered voltage.

In column 10, lines 43-47, claim 26 should be amended as follows:

26. The RF power sensor of claim 25, wherein the high pass filter further comprises a logarithmic converter that is configured to generate in parallel with the linear converter a second series of current pulses that are log proportional to an absolute value of the high pass filtered voltage.

This certificate supersedes the Certificate of Correction issued April 13, 2010.

Signed and Sealed this

Twenty-fourth Day of August, 2010

David J. Kappos
*Director of the United States Patent and Trademark Office*